(12) United States Patent
Koiso et al.

(10) Patent No.: US 6,822,990 B2
(45) Date of Patent: Nov. 23, 2004

(54) SEMICONDUCTOR LASER DEVICE

(75) Inventors: Takeshi Koiso, Sodegaura (JP); Tsuyoshi Fujimoto, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/129,550

(22) PCT Filed: Sep. 6, 2001

(86) PCT No.: PCT/JP01/07724
§ 371 (c)(1),
(2), (4) Date: May 8, 2002

(87) PCT Pub. No.: WO02/21578
PCT Pub. Date: Mar. 14, 2002

(65) Prior Publication Data
US 2002/0171094 A1 Nov. 21, 2002

(30) Foreign Application Priority Data
Sep. 8, 2000 (JP) ........................... 2000-274013

(51) Int. Cl.⁷ ................... H01S 5/00; H01S 3/091
(52) U.S. Cl. ................ 372/43; 372/45; 372/75; 372/46
(58) Field of Search .............. 372/43, 46, 45, 372/75

(56) References Cited

U.S. PATENT DOCUMENTS 4,799,228 A * 1/1989 Nagasaka et al. ............. 372/46
4,893,313 A * 1/1990 Hatakoshi et al. ............ 372/46
5,242,856 A 9/1993 Kurihara et al.
6,516,016 B1 * 2/2003 Fukunaga et al. ............ 372/45

FOREIGN PATENT DOCUMENTS

| JP | 62-51281 A | 3/1987 |
| JP | 2-125488 A | 5/1990 |
| JP | 3-80589 A | 4/1991 |
| JP | 3-126283 A | 5/1991 |
| JP | 5-90706 A | 4/1993 |
| JP | 6-188507 A | 7/1994 |
| JP | 6-260715 A | 9/1994 |
| JP | 11-154775 A | 6/1999 |

* cited by examiner

Primary Examiner—Jerome Jackson
Assistant Examiner—Joseph Nguyen
(74) Attorney, Agent, or Firm—Burns, Doane, Swecker & Mathis, L.L.P.

(57) ABSTRACT

A semiconductor laser device comprises first current blocking layers formed to define a stripe-shaped current injected region extending in the direction in a front facet from which a laser light is emitted and a rear facet opposing thereto are connected, and a second current blocking layer formed to transverse the stripe-shaped current injected region in the vicinity of the front facet. The first current blocking layers and the second current blocking layer are made of the same layer.

Accordingly, a current blocking structure is provided in the vicinity of the facet with the structure which is easily formed, causes no damage on the semiconductor laser device, and minimizes the property degradation, thereby a high facet COD level and high reliability in long-term continuous operations can be achieved.

35 Claims, 7 Drawing Sheets

SEMICONDUCTOR LASER DEVICE

TECHNICAL FIELD

The present invention relates to a high-power semiconductor laser having a current noninjected region in the vicinity of an end face (facet). In particular, the invention enhances a facet Catastrophic Optical Damage level higher and provides high reliability in long-term continuous operations.

BACKGROUND ART

A semiconductor laser device is utilized in various fields such as an excitation light source for a light amplifier used in the field of communications. These lasers are required for high power operations. However, there is a problem that it is difficult to obtain the semiconductor laser having enough life for carrying out the high power operations. In general, facet COD (Catastrophic Optical Damage) is known as the main factor of deterioration of the semiconductor laser. The COD is caused by the following steps. First, the non-radiative recombination is caused by defects produced in the vicinity of the facet. This results in an increase of the temperature. In addition, due to the temperature increase, the width of band gap is decreased and light absorption occurs, resulting in a vicious cycle of further temperature rise due to this. These steps induce melting of the facet and light output is deteriorated. Finally, a non-reversible destruction occurs According to the above description, it becomes important to reinforce the facet for obtaining the high-power semiconductor laser, in terms of preventing the facet COD. As one means for preventing the facet COD, there is a method in which no current is injected in the vicinity of the facet. In this case, since a current injection is suppressed in the vicinity of the facet, the vicinity of the facet becomes non-excitation state. Because of this, the non-radiative recombination is suppressed, which enables to improve the facet COD level. As specified examples, there are following methods. That is, no current is injected in the facet by forming an insulating film such as SiN under an electrode formed on the facet, no current is injected in the facet by forming a current blocking layer comprising a semiconductor layer on the facet, and no current is injected in the facet by carrying out ion implantation in the vicinity of the facet.

All the above methods have complicated fabrication steps. Further, the method causes damage to the semiconductor laser device, in which no current is injected in the facet by carrying out ion implantation in the vicinity of the facet. Furthermore, all these facet current blocking structures are formed at a distance from a waveguide layer. When providing the current blocking structure, it can be considered that a current wraparound will occur. The current wraparound is considered to cause serious influence as the distance between the current blocking structure and the active layer increases. In the case where the influence of the current wraparound becomes serious even if the current blocking structure is formed on the facet, current is wrapped around the facet, resulting in function degradation of the facet current blocking structure. Consequently, in consideration of the current wraparound, it is necessary to form wide facet current blocking region. When the facet current blocking region is widely formed, an influence caused by light absorption becomes serious in the region, so that the properties (threshold current, slope efficiency, temperature characteristic, or the like) of the semiconductor laser device are deteriorated. Because of this, any conventional methods described above are not necessarily preferable when forming a current blocking structure in the vicinity of the facet.

SUMMARY OF THE INVENTION

The invention is aimed at solving the above problems. An object of the invention is to provide a semiconductor laser device having high facet COD level, and high reliability in long-term continuous operations, by providing a current blocking structure in the vicinity of the facet. According to the structure, fabrication processes become easy, no damage are caused to the semiconductor laser device, and the property deterioration can be minimized.

To achieve the above object, the invention relates to a semiconductor laser device comprising:

an active layer;

an n-type waveguide layer;

a p-type waveguide layer, the active layer being interposed between the n-type and p-type waveguide layers;

n-type and p-type cladding layers formed so that outsides of the n-type and p-type waveguide layers are interposed therebetween;

first current blocking layers formed to define a stripe-shaped current injected region extending in a direction where a front facet of the device from which a laser light is emitted and a rear facet of the device opposing thereto are connected; and a second current blocking layer formed to transverse the stripe-shaped current injected region in a vicinity of the front facet, wherein the first current blocking layers and the second current blocking layer are made of the same layer.

According to the semiconductor laser device thus structured, the first current blocking layers, between which the stripe-shaped current injected region extending in the resonator direction is interposed, and the second current blocking layer, which is formed in order that no current is injected in one side or both sides of the vicinity of the facet, are made of the same layer, namely they are of the same composition and of the same film thickness. Because of this, fabrication processes become easy without increasing the number of processing steps compared with the conventional method. Consequently, the current blocking structure can be provided in the vicinity of the facet without damaging the semiconductor laser device. Accordingly, it is possible to provide the semiconductor laser device having high facet COD level and high reliability in long-term continuous operations. Not only the front facet but also the rear facet may be provided with the current blocking layer. One of both side portions of the second current blocking layer reaches the facet.

In the invention, a refractive index waveguide structure can be formed by an equivalent refractive index difference between the current injected region and the region of the current blocking layers. Further, a carrier blocking layer having larger energy gap than that of the waveguide layer is provided between the active layer and the waveguide layers, thereby a carrier is confined and a waveguide mode in the epitaxial direction can be expanded. Consequently, the facet COD level can be further improved by suppressing light intensity concentrated on the facet active layer.

In the invention, it is preferable that the first and second current blocking layers are formed inside the waveguide layer. The first and second current blocking layers may be formed in adjacent to the waveguide layer. In this case, when the width of the second current blocking layer is too large, waveguide loss is increased. Because of this, the second current blocking layer is desired to have a width within the range of 2 to 25 μm in practical use.

In the structure in which the current blocking layer in the vicinity of the facet having lower refractive index than that of the waveguide layer is formed in the waveguide layers or in adjacent to the waveguide layers, the waveguide mode profile in the vicinity of the facet can be shifted from the active layer by the use of the low refractive index layer in the vicinity of the facet. Accordingly, the beam energy density near the active layer in the vicinity of the facet can be reduced, and it is possible to provide the semiconductor laser device having substantially improved facet COD level and high reliability in long-term continuous operations. Further, since the waveguide layers are formed in the vicinity of the active layer, influence caused by the current wraparound into the active layer can be reduced by providing the facet current blocking structure in the waveguide layers. By doing this, the current blocking region necessary for ensuring improvement of the facet COD level and high reliability in long-term continuous operations, can be narrower compared with the case where the current blocking structure is provided over the waveguide layers. When the current blocking region becomes narrow, influence due to light absorption can be decreased, resulting in reducing degradation of the properties (threshold current, slope efficiency, temperature characteristic, or the like) of the semiconductor laser device.

Further, in the invention, it is preferable that the active layer comprises InGaAs and the waveguide layers are made of GaAs not including Al.

It becomes possible to use GaAs not including Al for forming a waveguide layer by the use of InGaAs for forming quantum wells of the active layer. Because a regrowing interface is not subject to oxidation during the formation processes of the current blocking layer, stability of processes can be achieved so that fine film can be formed. The reduction of electrical resistance and thermal resistance can be accomplished by using a waveguide layer made of GaAs not including Al.

When the current blocking layer in the vicinity of the facet has lower refractive index than the waveguide layer, a waveguide mode in the vicinity of the facet is influenced by the layer. Namely, the waveguide mode can be controlled by changing position, distance from the face and refractive index of the current blocking layer in the vicinity of the facet imbedded in the waveguide layer.

It is generally known as means for improving the facet COD level to decrease a beam energy density near the active layer formed on the facet. The beam energy density near the active layer is represented by a light confinement factor $\Gamma$. By providing a current noninjected region, position, width and refractive index of the current blocking layer in the vicinity of the facet are designed to satisfy the relationship between a light confinement factor $\Gamma^{1d}_{Injection}$ at the current injected region obtained through one dimensional slab waveguide path in the film thickness direction and a light confinement factor $\Gamma^{1d}_{Non-injection}$ in the film thickness direction at the current noninjected region in the vicinity of the facet as follows:

$$\Gamma^{1d}_{Injection} > \Gamma^{1d}_{Non-injection}$$

By doing this, it is found that beam energy density near the active layer on the facet can be reduced and the facet COD level can be raised. For example, in the embodiment mentioned below, the light confinement factor $\Gamma^{1d}_{Injection}$ at the current injected region shows 0.0084, whereas the light confinement factor $\Gamma^{1d}_{Non-injection}$ in the film thickness direction at the current noninjected region in the vicinity of the facet shows 0.0071. Consequently, the beam energy density near the active layer in the vicinity of the facet, can be reduced.

The light confinement factor $\Gamma$ of one dimensional slab waveguide path used herein is defined as the following formula.

$$\Gamma^{1d} = \frac{\int_b^a |E(x)|^2 dx}{\int_B^A |E(x)|^2 dx} \qquad \text{[Formula 1]}$$

wherein E(x) is an electric field in the film thickness direction, A and B are a maximum value and a minimum value of electric field coordinates, respectively. Further, a and b are values determined by an interface of the active layer.

Actually, in the waveguide mode, beams propagate dynamically. The state in which the waveguide mode is influenced by the current blocking layer in the vicinity of the facet, can be analyzed by e.g. a computer simulation using the beam propagation method. The position, width, and refractive index of the current blocking layer in the vicinity of the facet, which is imbedded in the waveguide layer, are designed to satisfy the relationship between a light confinement factor $\Gamma^{2d}_{injection}$ at the current injected region and a light intensity rate Thu 2d $_{Facets}$ at the active layer in the front facet with respect to a propagation mode when propagating the waveguide mode at a current injected region into a current noninjected region by the beam propagation method as follows:

$$\Gamma^{2d}_{Injection} > \Gamma^{2d}_{Facet}$$

Figure 7:
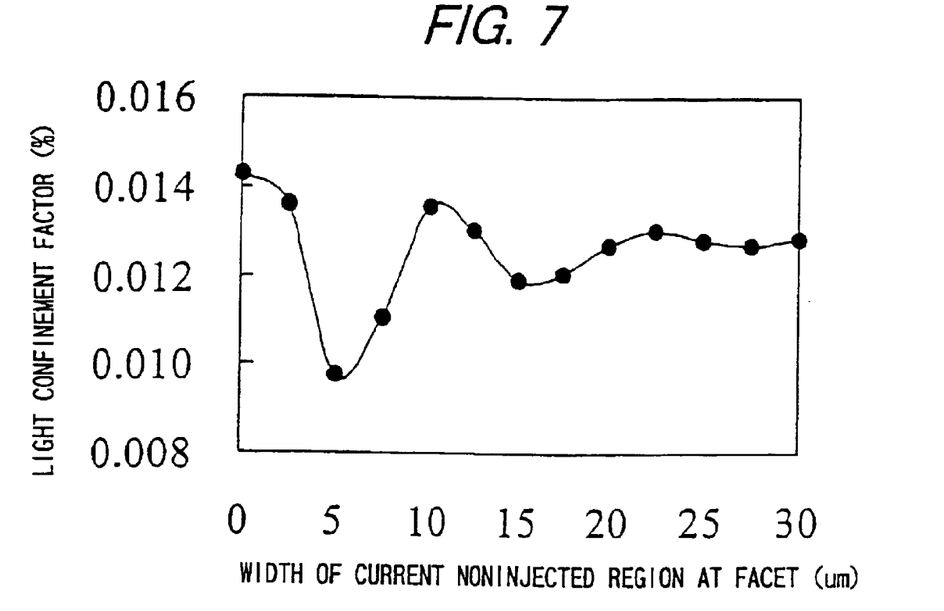
FIG. 7 is a view showing the relationship between the width of the current noninjected region at the facet and the light confinement factor.

By doing this, it is found that the waveguide mode is controlled and the facet COD level can be increased. Further, beam energy density near the active layer on the facet is designed to take on values between adjacent inflection points including a minimum value, thereby the semiconductor laser device having a higher facet COD level can be obtained. For example, FIG. 7 is a graph of an analysis obtained by a computer simulation (BPM CAD produced by Optiwave Corporation) using the beam propagation method. In the structure shown in FIG. 3 according to embodiments mentioned below, an analysis is carried out on the relationship between a light intensity rate (light confinement factor) $\Gamma$ of the active layer with respect to the propagation mode at the side portion (reference numeral 23a in FIG. 3C) opposed to the side portion adjacent to a front facet 40, which is one of both side portions of the current blocking layer 23 provided in the front facet, and the width W of the current blocking layer 23 (current noninjected region). The light confinement factor $\Gamma$ used herein is defined as the following formula.

$$\Gamma^{2d} = \frac{\int_{c,d}^{a,b} |E(x, y)|^2 dx dy}{\int_{C,D}^{A,B} |E(x, y)|^2 dx dy} \qquad \text{[Formula 2]}$$

wherein E(x, y) is an electric field, (A, B) and (C, D) are a maximum value and a minimum value of electric field coordinates, respectively, and (a, b) and (c, d) are values determined by an interface of the active layer.

As apparent from FIG. 7, in this case, the light confinement factor becomes a minimum value when the current blocking layer on the facet has a width of about 5 μm or 15 μm. It should be noted that the optimum value of the width of the current blocking layer in the vicinity of the facet is designed as necessary depending on the layer structure in order to minimize the light confinement factor at facets. Further, the width of the current blocking layer, which minimizes the light confinement factor, is varied by changing position, width and refractive index of the current blocking layer in the vicinity of the facet.

DESCRIPTION OF EXEMPLARY EMBODIMENTS

Figure 1A:
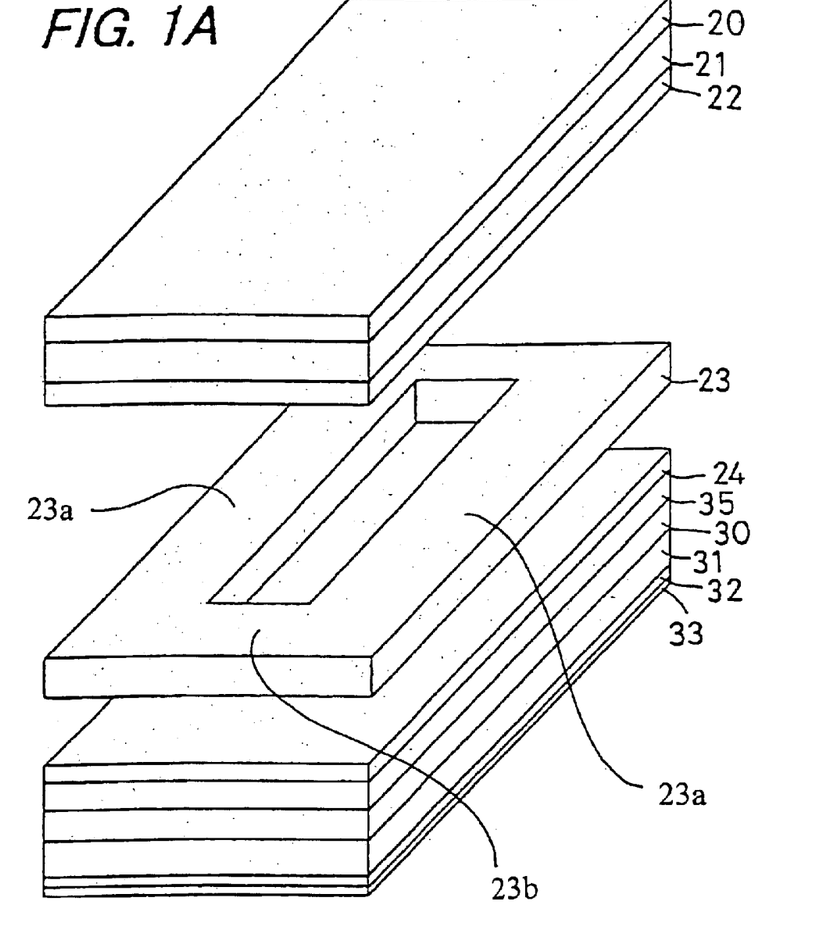
FIG. 1A is a perspective view of an example of a semiconductor laser device according to the invention.
Figure 2:
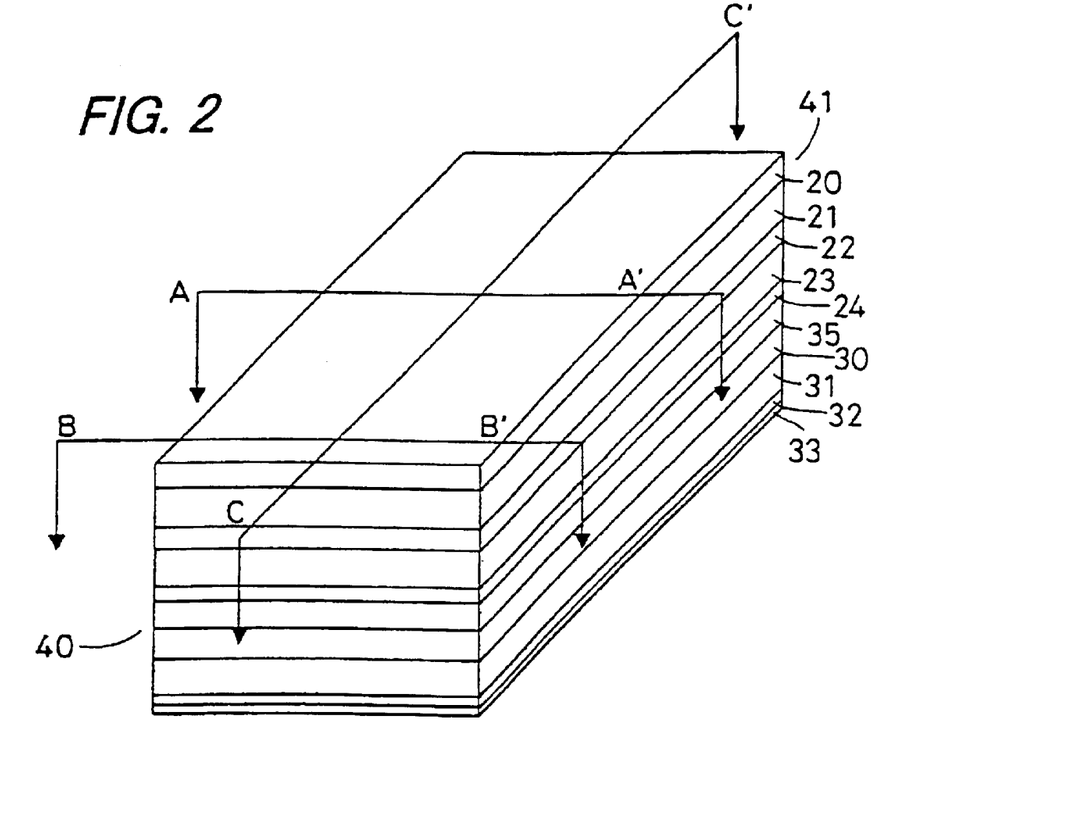
FIG. 2 is a view for illustrating an example of a current blocking layer according to the invention.
Figure 3A:
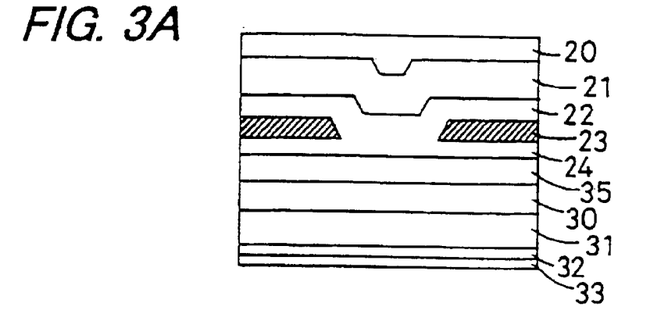
FIGS. 3A–3C are cross sectional views of the semiconductor laser device shown in FIG. 1.
Figure 3B:
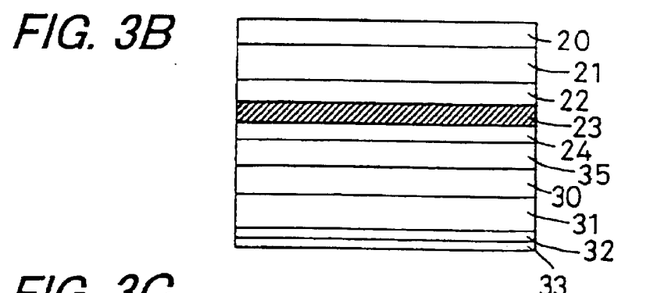
Figure 3C:
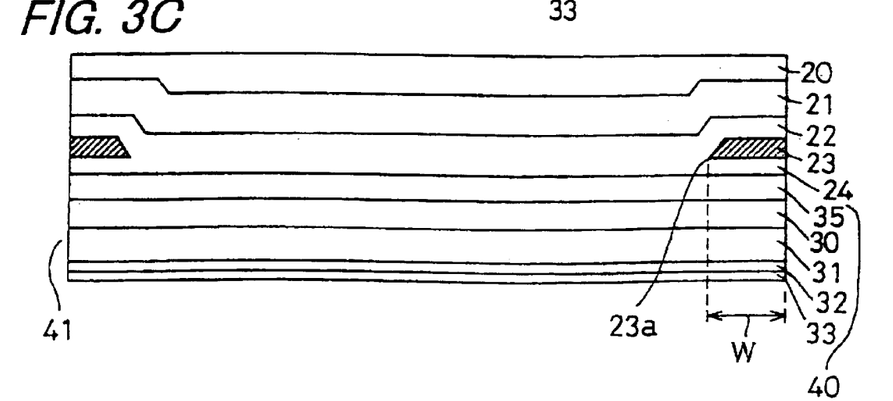

Now referring to the drawings, preferred embodiments of the invention are described below. FIG. 2 is a perspective view of an example of a semiconductor laser device according to the invention. FIG. 1A shows a current blocking layer 23 according to the invention by virtually dividing the layer configuration for the sake of clarity. FIGS. 3A–3C are cross sectional views of FIG. 2. FIG. 3A is a cross section taken along the line A–A' in a direction at right angles to the resonator length direction of the laser and located at a distance from an emitting facet (front facet) and a rear facet. FIG. 3B show the vicinity of the emitting facet taken along the cross sectional line B–B' parallel to the line A–A'. FIG. 3C is a cross section taken along the line C–C' which is almost centered on the stripe in which light is waveguide in the resonator length direction.

Figure 1B:
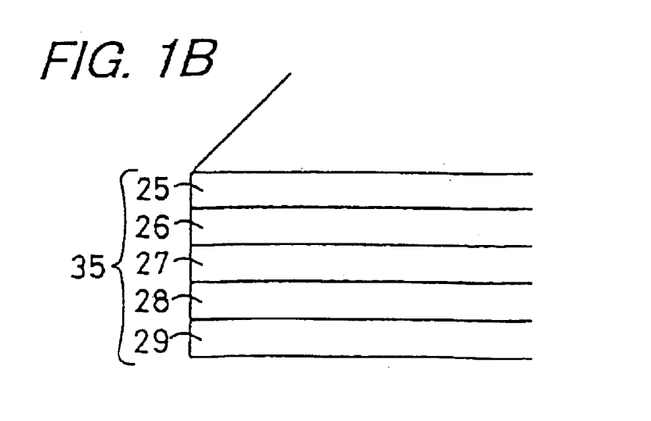
FIG. 1B is a magnified view of the portion.

Referring to these figures, a buffer layer 32, an n-side cladding layer, 31, an n-side waveguide layer 30, an active layer region 35, a p-side waveguide layer 24, a current blocking layer 23, a p-side waveguide layer 22, a p-side cladding layer 21, and a p-side cap layer 20 are formed on a n-GaAs substrate 33. As shown in a magnified view FIG. 1B, the active layer region 35 comprises an n-side carrier blocking layer 29, an n-side side barrier layer 28, an active layer composed of quantum well layers and a barrier layer for interpolating these, a p-side side barrier layer 26, and a p-side carrier blocking layer 25. The First current blocking portions 23a of the current blocking layer 23 herein are provided at both sides of the stripe to determine a stripe S in the resonator length direction. Also, in the vicinity of a front facet 40 and a rear facet 41, a second current blocking portion 23b is provided transverse to the stripe S.

Figure 4A:
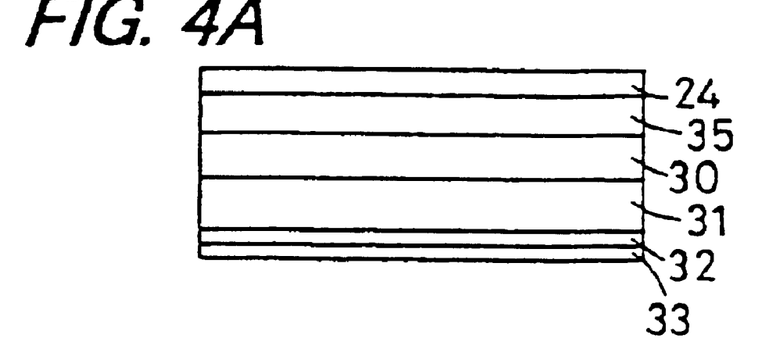
FIGS. 4A–4C are views for illustrating fabrication steps of the semiconductor laser shown in FIG. 1.
Figure 4B:
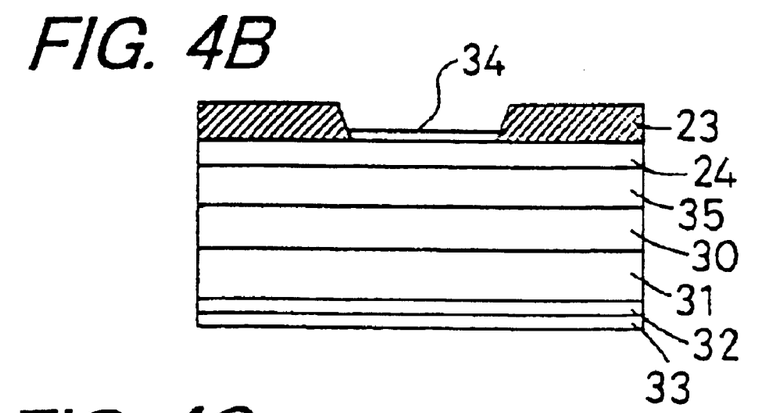
Figure 4C:
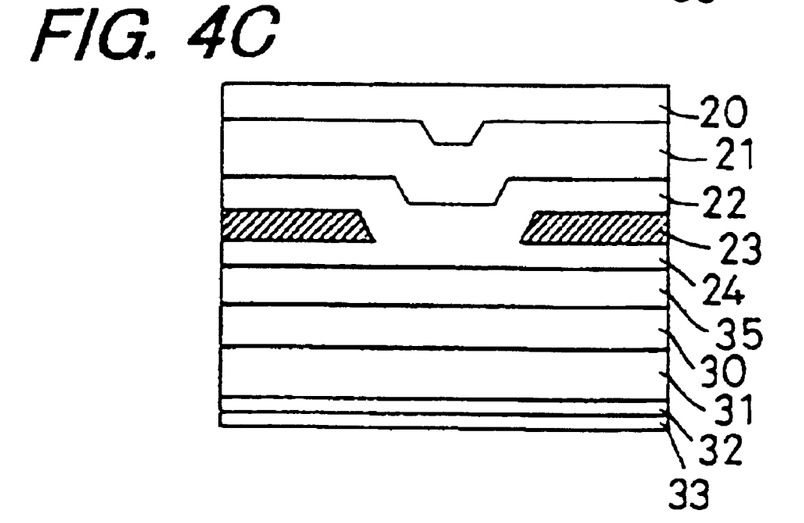

Then, a method of fabricating the semiconductor laser device will be described. FIGS. 4A–4C show cross sectional portions taken along the line A–A' in FIG. 2 in the order of fabrication steps. As shown in FIG. 4A, first, an n-type ($1 \times 10^{23}$ $^{m-3}$) buffer layer 32 made of GaAs (0.5 μm), an n-type ($1 \times 10^{24}$ m$^{-3}$) cladding layer 31 made of $Al_{0.09}Ga_{0.91}As$ (2.5 μm), an n-type ($1 \times 10^{23}$ m$^{-3}$) waveguide layer 30 made of GaAs (0.45 μm), an n-type ($1 \times 10^{24}$ m$^{-3}$) carrier blocking layer 29 made of $Al_{0.4}Ga_{0.6}As$ (0.02 μm), a side barrier layer 28 made of $Al_{0.1}Ga_{0.9}As$ (0.05 μm), an active layer 27 comprising two quantum well layers made of $In_{0.18}Ga_{0.82}As$ (0.007 μm/one) and a barrier layer made of $Al_{0.1}Ga_{0.9}As$ (0.006 μm) for interpolating the quantum well layers, a side barrier layer 26 made of $Al_{0.1}Ga_{0.9}As$ (0.05 μm), a p-type ($1 \times 10^{24}$ $^{m-3}$) carrier blocking layer 25 made of $Al_{0.4}Ga_{0.6}As$ (0.02 μm), and a p-type ($1 \times 10^{24}$ m$^{-3}$) waveguide layer 24 made of GaAs (0.1 μm) are successively formed on an n-type ($1 \times 10^{23}$ m$^{-3}$)-GaAs substrate 33. It should be noted that a first crystal growth is carried out by a Metal Organic Chemical Vapor Deposition (MOCVD) method, and a Molecular Beam Epitaxial (MBE) method and others can be used.

Then, the substrate in which crystal growth is carried out in this way, is taken out from the crystal growth apparatus and put into e.g. the electron beam vapor apparatus, thereby forming a mask 34 made of e.g. $SiO_2$ on an entire surface. Thereafter, the mask is removed except the central region by photolithography technique to form a stripe-shaped window, thereby forming a stripe-shaped mask 34. At the same time, the mask in the vicinity of the facet is removed so as to form a current noninjected region on the facet. Since the mask 34 is extremely thin, it can be formed by conventional photolithography technique with high accuracy and improved reproducibility.

In a second crystal growth, the substrate having the mask 34 is replaced into the crystal growth apparatus to selectively grow a current blocking layer 23 made of an n-type ($1 \times 10^{24}$ m$^{-3}$) $Al_{0.09}Ga_{0.91}As$ (0.18 μm) on a p-type ($1 \times 1024$ m$^{-3}$) waveguide layer 24. Then, as shown in FIG. 46, the layer structure having no crystal growth can be obtained in the region attached with the mask 34. The mask 34 is removed by e.g. hydrofluoric acid solution. Of course, the current blocking layer may have such a layer structure having two layers or more. Further, after forming the current blocking layer on the entire surface, only the central region to be applied with a current may be removed by etching. In this way, the first current blocking layers and the second current blocking layer can be formed at the same time as the same layer.

In a third crystal growth, as shown in FIG. 4C, an upper p-type ($1 \times 10^{23m-3}$) waveguide layer 22 made of GaAs (0.35 μm), a p-type ($1 \times 10^{24}$ m$^{-3}$) cladding layer 21 made of $Al_{0.32}Ga_{0.68}As$ (0.78 μm), and a cap layer 20 made of a p-type ($1 \times 10^{24}$ m$^{-3}$)-GaAs (1.4 μm) are successively formed. Then, one example of the semiconductor laser device of the invention can be obtained as shown in FIG. 2. Thereafter, an electrode is formed on the substrate and the cap layer 20 and a current is applied thereto, thereby laser oscillation can be performed by a carrier injection. Thus obtained semiconductor laser device is provided with the current blocking layer in the waveguide layer in the vicinity of the facet. In the current injected region of the semiconductor laser, a light confinement factor $\Gamma^{1d}{}_{Injection}$ in the film thickness direction is fixed without depending on the resonator length direction. In the current noninjected region, a light confinement factor $\Gamma^{1d}{}_{Non-injection}$ in the film thickness direction can be made smaller than the $\Gamma^{1d}{}_{injection}$ by changing position, width, and refractive index of the second current blocking layer. Further, when propagating the waveguide mode of the current injected region to the current noninjected region by the beam propagation method, a light intensity rate $\Gamma^{2d}{}_{Facet}$ in the active layer on the front facet with respect to propagation mode can be made smaller than a $\Gamma^{2d}{}_{Injection}$ by changing position, width, and refractive index of the second current blocking layer. In the embodiment, for example, the $\Gamma^{2d}{}_{Facet}$ can be made smaller than the $\Gamma^{2d}{}_{Injection}$ as shown in FIG. 7, and also, the $\Gamma^{2d}{}_{Facet}$ can be further decreased by selecting the width of the current blocking layer in order that the $\Gamma^{2d}{}_{Facet}$ in the vicinity of the active layer on the facet takes on values between adjacent inflection points including a minimum value.

By the way, the position of the current blocking layer is not limited to the inside of the waveguide layer and it may be adjacent to the waveguide layer. In the semiconductor laser device thus structured, since a current injection in the vicinity of the facet is suppressed, the vicinity of the facet is in the state of non-excitation. Because of this, non-radiative recombination is suppressed, which enables to improve the facet COD level. The semiconductor laser device of the invention may have a ridge structure in which the active region is sandwiched between the current blocking layers.

Further, the first current blocking layers and the second current blocking layer may be continuous as described in the embodiment, or they may be partially discontinuous to the extent to which properties are not deteriorated.

Figure 5:
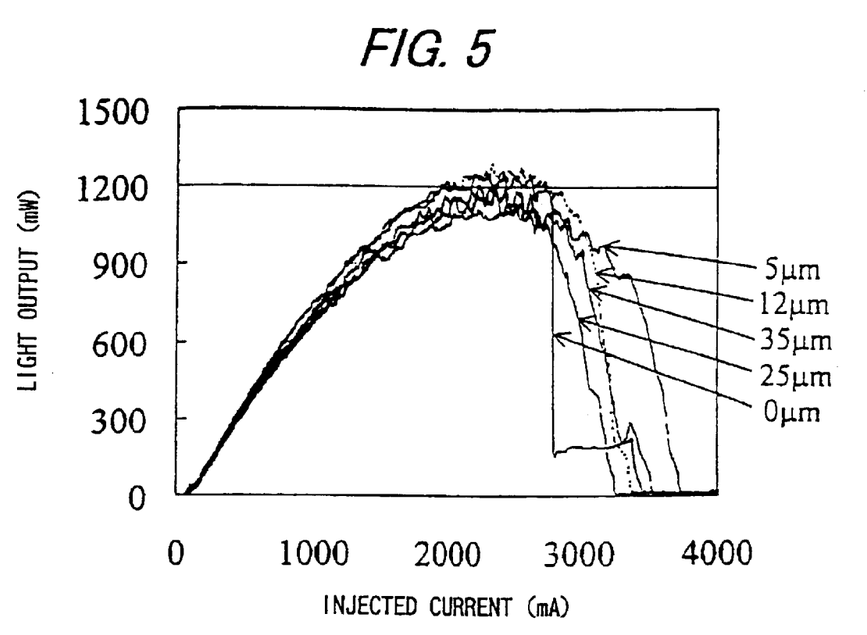
FIG. 5 is a graph showing an output property of a semiconductor laser device.

FIG. 5 shows the state of light output when an overcurrent is applied to the semiconductor laser device obtained by the above-described way. In the embodiment, some samples are prepared, which has various widths X of the current blocking layer crossing the stripe in the vicinity of the facet imbedded in the waveguide layer. In the vicinity of the facet, one edge portion of the current blocking layer comes in contact with the facet and remaining edge portions are placed in the location at a distance of x from the facet in the resonator length direction. When the current-light output characteristic is measured with respect to these samples, in the case of device having x=0 µm, namely device having no current blocking layer in the vicinity of the facet, COD occurs during the passage of a current. As opposed to this, in the case of device having the current blocking layer in the vicinity of the facet, COD does not occur but becomes thermally saturated thoroughly. Thereafter, when applying an overcurrent again to the device having the current blocking layer in the vicinity of the facet, reproducibility can be observed. According to the embodiment, since the facet current blocking layer is formed in the waveguide layer near the active layer, an influence caused by a current wraparound into the active layer is reduced. According to the embodiment of the invention, improvement of the facet COD level can be observed at x=5 µm as shown in FIG. 5. Consequently, in the case where the current blocking layer has narrow region, the influence of a current wraparound into the active region is reduced, thereby it is found that the current blocking structure functions properly.

Figure 6A:
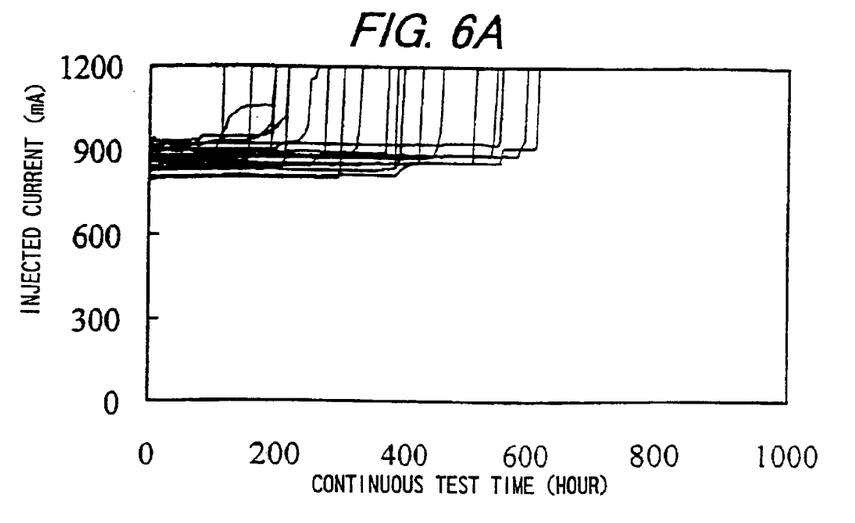
FIGS. 6A–6B are views showing a time varying an injected current into a semiconductor laser device.
Figure 6B:
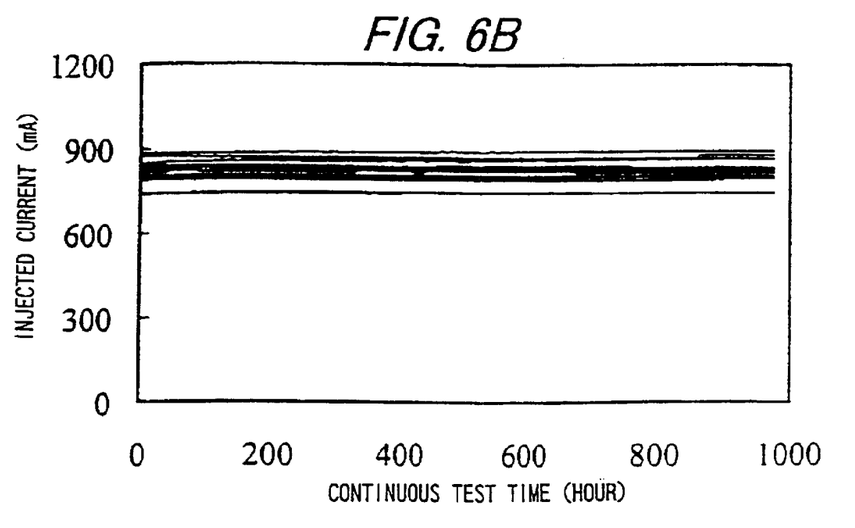

Further, FIGS. 6A–6B show results obtained by measurement of an injected current changed over time, where the environmental temperature at 70° C. is used and an injection current is controlled to output fixed laser light. FIG. 6A shows the result regarding the semiconductor laser device having no current blocking layer in the vicinity of the facet. Since operation is carried out under the state in which a current is controlled to make fixed output, a current is increased in the case of deterioration. Referring to FIG. 6A, it can be found that the device is deteriorated in early stage with regard to the semiconductor laser device having no current blocking layer in the vicinity of the facet.

On the other hand, FIG. 6B shows the result of tests using respective four devices of four varieties of semiconductor laser devices having x=5 µm, 12 µm, 25 µm, and 35 µm as samples having different widths x of the second current blocking layer in the vicinity of the facet. It is found that the semiconductor laser device, which has the current blocking layer in the vicinity of the facet, operates continuously with high stability for a long time without deterioration.

As apparent from the above, the facet COD level is substantially improved by the current blocking layer in the vicinity of the facet. Further, according to the results, in the case of narrow region of the current blocking layer, namely x=5 µm, it is found that high reliability can be ensured at continuous operations for a long duration.

The invention is not limited to the above mentioned embodiments, and applicable to semiconductor lasers having various structures and compositions.

What is claimed is:

1. A semiconductor laser device comprising:
   an active layer;
   an n-type waveguide layer;
   a p-type waveguide layer;
   the active layer being interposed between the n-type and p-type waveguide layers;
   n-type and p-type cladding layers located so that outsides of the n-type and p-type waveguide layers are interposed therebetween;
   first current blocking portions defining a stripe-shaped current injected region extending in a direction that extends from a front facet of the device from which a laser light is emitted to a rear facet opposing thereto; and
   a second current blocking portion located transverse to the stripe-shaped current injected region in a vicinity of the front facet,
   wherein the first current blocking portions and the second current blocking portion are made of the same layer, and a refractive index waveguide structure is formed by an equivalent refractive index difference between the current injected region and regions of the first and second current blocking portions.

2. The semiconductor laser device of claim 1, wherein a carrier blocking layer is provided between the active layer and the p-type waveguide layer and/or between the active layer and the n-type waveguide layer, and the carrier blocking layer has a larger energy gap than that of the waveguide layer.

3. The semiconductor device of claim 2, wherein the first and second current blocking portions are located inside the p-type wave guide layer and/or the n-type waveguide layer.

4. The semiconductor device of claim 2, wherein the first and second current blocking portions are located adjacent to the p-type waveguide layer and/or the n-type waveguide layer.

5. The semiconductor laser device of claim 4, wherein the active layer comprises InGaAs and the waveguide layers comprise GaAs and are free of Al.

6. The semiconductor laser device of claim 4, wherein the active layer is composed of multiple layers comprising an InGaAsP layer, and the waveguide layers comprise GaAs and are free of Al.

7. The semiconductor laser device of claim 6, wherein the second current blocking portion is formed so that the following relationship is fulfilled:

$$\Gamma^{1d}{}_{Injection} > \Gamma^{1d}{}_{Non\text{-}injection}$$

wherein $\Gamma^{1d}{}_{Injection}$ is a light confinement factor at the current injected region and $\Gamma^{1d}{}_{Non\text{-}injection}$ is a light confinement factor at the current noninjected region.

8. The semiconductor laser device of claim 7, wherein the second current blocking portion is formed so that the following relationship is fulfilled:

$$\Gamma^{2d}{}_{Injection} > \Gamma^{2d}{}_{Facet}$$

wherein $\Gamma^{2d}{}_{Injection}$ is a light confinement factor at the current injected region and $\Gamma^{2d}{}_{Facet}$ is a light intensity rate at the active layer in the front facet with respect to a propagation mode when propagating the waveguide mode at the current injected region into a current noninjected region by the beam propagation method.

9. The semiconductor laser device of claim 8, wherein position, thickness and width of the second current blocking portion are defined so that the $\Gamma^{2d}{}_{Facet}$ exists between adjacent inflection points including a minimum value.

10. The semiconductor laser device of claim 5, wherein the second current blocking portion has a width within the range of 2 to 25 µm.

11. A semiconductor laser device comprising:
- an active layer;
- an n-type waveguide layer;
- a p-type waveguide layer;
- the active layer being interposed between the n-type and p-type waveguide layers;
- n-type and p-type cladding layers located so that outsides of the n-type and p-type waveguide layers are interposed therebetween;
- first current blocking portions defining a stripe-shaped current injected region extending in a direction that extends from a front facet of the device from which a laser light is emitted to a rear facet opposing thereto; and
- a second current blocking portion located transverse to the stripe-shaped current injected region in a vicinity of the front facet,
- wherein the second current blocking portion is formed so that the following relationship is fulfilled:

$$\Gamma^{1d}{}_{Injection} > \Gamma^{1d}{}_{Non\text{-}injection}$$

wherein $\Gamma^{1d}{}_{Injection}$ is a light confinement factor at the current injected region and $\Gamma^{1d}{}_{Non\text{-}injection}$ is a light confinement factor at the current noninjected region.

12. A semiconductor laser device comprising:
- an active layer;
- an n-type waveguide layer;
- a p-type waveguide layer;
- the active layer being interposed between the n-type and p-type waveguide layers;
- n-type and p-type cladding layers located so that outsides of the n-type and p-type waveguide layers are interposed therebetween;
- first current blocking portions defining a stripe-shaped current injected region extending in a direction that extends from a front facet of the device from which a laser light is emitted to a rear facet opposing thereto; and
- a second current blocking portion located transverse to the stripe-shaped current injected region in a vicinity of the front facet,
- wherein the second current blocking portion is formed so that the following relationship is fulfilled:

$$\Gamma^{2d}{}_{injection} > \Gamma^{2d}{}_{Facet}$$

wherein $\Gamma^{2d}{}_{Injection}$ is a light confinement factor at the current injected region and $\Gamma^{2d}{}_{Facet}$ is a light intensity rate at the active layer in the front facet with respect to a propagation mode when propagating the wavegduide mode at the current injected region into a current noninjected region by the beam propagation method.

13. The semiconductor laser device of claim 12, wherein position, thickness and width of the second current blocking portion are defined so that the $\Gamma^{2d}{}_{Facet}$ exists between adjacent inflection points including, a minimum value.

14. The semiconductor laser device of claim 13, wherein the second current blocking portion has a width within the range of 2 to 25 µm.

15. The semiconductor laser device of claim 14, wherein a refractive index waveguide structure is formed by an equivalent refractive index difference between the current injected region and regions of the first and second current blocking portions.

16. The semiconductor laser device of claim 15, wherein a carrier blocking layer is provided between the active layer and the p-type waveguide layer and/or between the active layer and the n-type waveguide layer, and the carrier blocking layer has a larger energy gap than that of the waveguide layer.

17. The semiconductor laser device of claim 15, wherein the first and second current blocking portions are located inside the p-type waveguide layer and/or the n-type waveguide layer.

18. The semiconductor laser device of claim 17, wherein the first and second current blocking portions are located adjacent to the p-type waveguide layer and/or the n-type waveguide layer.

19. The semiconductor laser device of claim 18, wherein the active layer comprises InGaAs and the waveguide layers comprise GaAs and are free of Al.

20. The semiconductor laser device of claim 18, wherein the active layer is composed of multiple layers comprising an InGaAsP layer, and the waveguide layers comprise GaAs and are free of Al.

21. The semiconductor device of claim 1, wherein the first and second current blocking portions are located inside the p-type waveguide layers and/or the n-type waveguide layer.

22. The semiconductor device of claim 1, wherein the first and second current blocking portions are located adjacent to the p-type waveguide layer and/or the n-type waveguide layer.

23. The semiconductor laser device of claim 3, wherein the active layer comprises InGaAs and the waveguide layers comprise GaAs and are free of Al.

24. The semiconductor laser device of claim 3, wherein the active layer is composed of multiple layers comprising an InGaAsP layer and the waveguide layer comprise GaAs and are free of Al.

25. The semiconductor laser device of claim 1, wherein the second current blocking layer portion is formed so that the following relationship is fulfilled:

$$\Gamma^{1d}{}_{Injection} > \Gamma^{1d}{}_{Non\text{-}injection}$$

wherein $\Gamma^{1d}{}_{Injection}$ is a light confinement factor at the current injected region and $\Gamma^{1d}{}_{Non\text{-}injection}$ is a light confinement factor at the current noninjected region.

26. The semiconductor laser device of claim 1, wherein the second current blocking portion is formed so that the following relationship is fulfilled:

$$\Gamma^{2d}{}_{injection} > \Gamma^{2d}{}_{Facet}$$

wherein $\Gamma^{2d}{}_{Injection}$ is a light confinement factor at the current injected region and $\Gamma^{2d}{}_{Facet}$ is a light intensity rate at the active layer in the front facet with respect to a propagation mode when propagating the waveguide mode at the current injected region into a current noninjected region by the beam propagation method.

27. The semiconductor laser device of claim 3, wherein the second current blocking portion has a width within the range of 2 to 25 µm.

28. The semiconductor laser device of claim 11, wherein the second current blocking portion has a width within the range of 2 to 25 µm.

29. The semiconductor laser device of claim 11, wherein a refractive index waveguide structure is formed by an equivalent refractive index difference between the current injected region and regions of the first and second current blocking portions.

30. The semiconductor laser device of claim 11, wherein a carrier blocking layer is provided between the active layer and the p-type waveguide layer and/or between the active layer and the n-type waveguide layer, and the carrier blocking layer has a larger energy gap than that of the waveguide layer.

31. The semiconductor laser device of claim 11, wherein the first and second current blocking portions are located inside the p-type waveguide layer and/or the n-type waveguide layer.

32. The semiconductor laser device of claim 11, wherein the first and second current blocking portions are located adjacent to the p-type waveguide layer and/or the n-type waveguide layer.

33. The semiconductor laser device of claim 17, wherein the active layer comprises InGaAs and the waveguide layers comprise GaAs and are free of Al.

34. The semiconductor laser device of claim 17, wherein the active layer is composed of multiple layers comprising an InGaAsP layer, and the waveguide layers comprise GaAs and are free of Al.

35. A semiconductor laser device comprising:

an active layer;

an n-type waveguide layer;

a p-type waveguide layer;

the active layer being interposed between the n-type and p-type waveguide layers;

an n-type cladding layer and a p-type cladding layer located such that the n-type and p-type waveguide layers are interposed therebetween;

first current blocking portions located to define a stripe-shaped current injected region extending in a direction between a light emitting facet and an opposing facet of the semiconductor laser device; and a second current blocking portion located transverse to the stripe-shaped current injected region in a vicinity of the light-emitting facet, wherein the first current blocking portions and the second current blocking portion are made of the same layer.

* * * * *